United States Patent [19]

Kirk et al.

[11] Patent Number: 4,573,254
[45] Date of Patent: Mar. 4, 1986

[54] APPARATUS FOR MAINTAINING ELECTRONIC COMPONENT PIN ALIGNMENT

[75] Inventors: Kenneth H. Kirk, Harleysville; Robert R. Tarbuck, Ardmore, both of Pa.

[73] Assignee: Sperry Corporation, New York, N.Y.

[21] Appl. No.: 686,121

[22] Filed: Dec. 24, 1984

[51] Int. Cl.[4] ................................................ H05K 3/30
[52] U.S. Cl. .................. 29/564.8; 29/566.3; 29/741; 29/837; 83/925 R; 140/147
[58] Field of Search .................. 29/564.8, 566.3, 566.2, 29/566.1, 753, 837, 838, 26 A, 741, 705–708; 140/105, 147; 83/409.2, 580, 925 R, 926 B; 227/1, 7

[56] References Cited

U.S. PATENT DOCUMENTS

| | | | |
|---|---|---|---|
| 3,574,935 | 4/1971 | Berg . | |
| 3,941,165 | 3/1976 | Bowden et al. | 140/147 |
| 3,972,356 | 8/1976 | Kjarsgaard | 140/147 |
| 4,052,793 | 10/1977 | Coughlin et al. | 33/180 R |
| 4,292,116 | 9/1981 | Takahashi et al. | 29/740 |
| 4,340,774 | 7/1982 | Nilsson et al. | 29/837 |
| 4,375,126 | 3/1983 | Düll et al. | 29/740 |
| 4,486,928 | 12/1984 | Tucker et al. | 29/26 A |
| 4,498,232 | 2/1985 | Ertl | 29/837 |

FOREIGN PATENT DOCUMENTS 2917431 11/1980 Fed. Rep. of Germany ........ 83/580

Primary Examiner—Z. R. Bilinsky
Attorney, Agent, or Firm—James R. Bell; Thomas J. Scott; Marshall M. Truex

[57] ABSTRACT

An apparatus for maintaining electronic component pin alignment includes a support member having an adjacent lead shear, a stationary nest, a printed circuit board and a component feeder. A component in the component feeder includes a chip having a plurality of leads. The leads have a first end connected to the chip and a second free end. A movable lead guide engages the first end of the leads. A robot is mounted adjacent the support member for picking up the component from the component feeder, inserting the component into the stationary nest moving the component relative to the stationary nest for moving the lead guide from the first end of the leads toward the second free end of the leads, moving the component from the stationary nest to the shear for shearing the second free end of the leads, and moving the component from the shear to the printed circuit board and urging the leads into corresponding holes formed in the printed circuit board. The stationary nest includes a planar member having an elongated slot formed therein. The elongated slot has an open end, two side walls and an end wall. The robot moves the component into the elongated slot through the open end so that the side walls and the end wall are between the chip and the lead guide.

11 Claims, 6 Drawing Figures

APPARATUS FOR MAINTAINING ELECTRONIC COMPONENT PIN ALIGNMENT

BACKGROUND OF THE INVENTION

1. Field of Invention

This invention relates generally to work holders for electrical circuit assemblages and more particularly to automated insertion of integrated circuit component pins into corresponding pin holes in a printed circuit board.

2. Background Description

Integrated circuit components of the type having a plurality of pins or leads extending therefrom, require mounting on a printed circuit board by inserting the leads into corresponding holes predrilled through the board. Thereafter, solder connections are made and the components become secured to the board.

Since the leads may, in some cases, number as many as fifty-four, it is difficult to simultaneously align all the leads with the holes to permit insertion. If the array of leads is misaligned with the array of holes and insertion is attempted, the result is that the aligned leads are inserted and the misaligned leads of the expensive component become bent and damaged. The damaged component is then removed and either repaired or discarded. These leads are easily bent since they are of a small diameter, e.g. 0.0105 inches, and therefore are substantially flexible. The leads are typically inserted into holes having a diameter of about 0.014 inches.

Automated insertion is commonly achieved by robotic arms. Thus in order to be successfully achieved, there are stringent limitations on tolerances permitted for lead to hole alignment. Therefore, it is of utmost importance that lead to hole registration be substantially maintained during the automated operation of mounting the components on the board.

The foregoing illustrates limitations known to exist in present devices. Thus, it is apparent that it would be advantageous to provide an alternative directed to overcoming one or more of the limitations set forth above. Accordingly, a suitable alternative is provided including features more fully disclosed hereinafter.

SUMMARY OF THE INVENTION

In one aspect of the present invention, this is accomplished by providing an apparatus for maintaining electronic component pin alignment including a support member, an adjacent lead shear, a stationary nest, a printed circuit board and a component feeder. A component in the component feeder includes a chip having a plurality of leads. The leads have a first end connected to the chip and also have a second free end. A movable lead guide engages the first end of the leads. A robot is mounted adjacent the support member for picking up the component from the component feeder, inserting the component in the stationary nest, moving the component relative to the stationary nest for moving the lead guide from the first end of the leads toward the second free end of the leads, moving the component from the stationary nest to the shear for shearing the second free end of the leads, and moving the component from the shear to the printed circuit board and urging the leads into corresponding holes formed in the printed circuit board.

The foregoing and other aspects will become apparent from the following detailed description of the invention when considered in conjunction with the accompanying drawing. It is to be expressly understood, however, that the drawing is not intended as a definition of the invention but is for the purpose of illustration only.

BRIEF DESCRIPION OF THE DRAWING

DESCRIPTION OF THE PREFERRED EMBODIMENT

Figure 1:
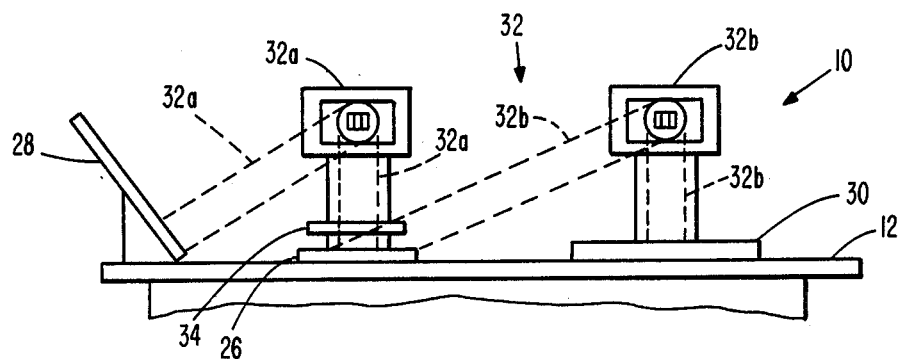
FIG. 1 is a frontal view illustrating an embodiment of a robotic work station.
Figure 3:
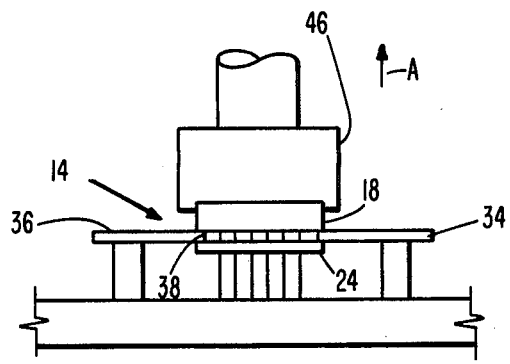
FIG. 3 is a view illustrating an embodiment of a component inserted into the stationary nest of FIG. 2 having a lead guide at a first end of the leads.
Figure 4:
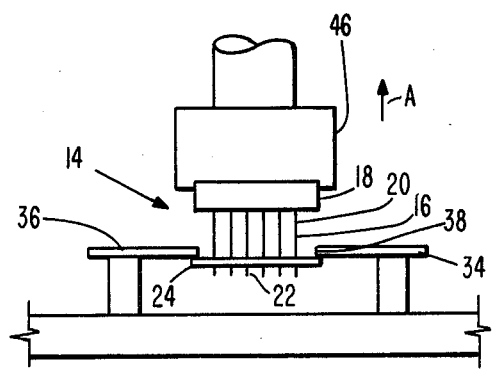
FIG. 4 is a view illustrating the lead guide moved to the second end of the leads.
Figure 5:
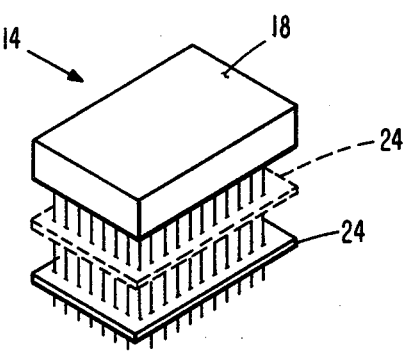
FIG. 5 is a perspective view of an embodiment of a component having a movable lead guide.
Figure 6:
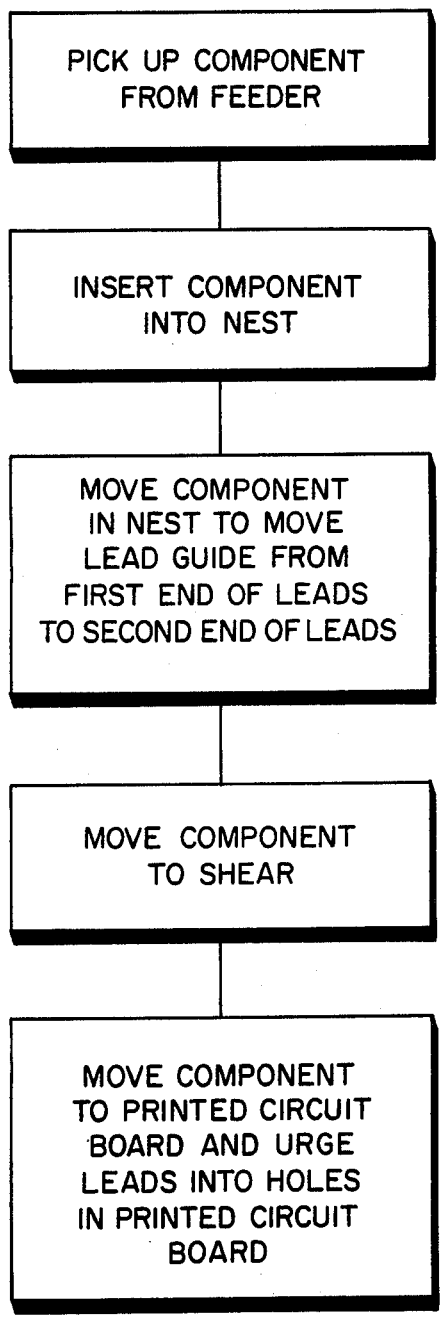
FIG. 6 is a diagram illustrating steps in the operation of the robotic work station of FIG. 1.

FIG. 1 illustrates an apparatus for maintaining electronic component pin alignment. The apparatus is generally designated 10 and includes a support member 12 such as a table fabricated of a suitable metal. Typical components 14 include (54 pin) LSI and (24 pin) SSI devices. The components 14, such as that illustrated in FIGS. 3, 4 and 5, are fabricated with pins or leads 16. The components 14 include a ceramic carrier or chip 18 and leads 16 have a first end 20 attached to chip 18. Leads 16 extend to a second or free end 22. Leads 16 are attached to chip 18 within plus or minus 0.002 inches of a designated array position.

A lead guide 24, formed of a suitable synthetic material, is engaged with leads 16 and is movable on leads 16 between a first position (shown in dotted line in FIG. 5) adjacent first end 20, and a second position (shown in solid line in FIG. 5) adjacent second end 22. Lead guide 24 is mounted on leads 16 during production of component 14 and is used to align second ends 22 of leads 16 within plus or minus 0.003 inches of their designated array position. In this manner, leads 16 are more likely to be aligned for insertion into the arrayed holes formed in an associated printed circuit board such as board 30 mounted on support member 12.

A well-known lead shear 26 is mounted on support member 12. Shear 26 is provided for shearing the free ends 22 of leads 16 to a uniform length prior to mounting components 14 on printed circuit board 30. An associated feeder 28 is provided on support member 12 for storing a supply of the components 14.

Robotic means 32, preferably a robot manufactured by General Electric Robotic and Vision Systems of Orlando, Fla. and sold under the designation Model A12, is mounted adjacent support member 12. Robotic means 32 has acceptable positioning accuracy consistent with this type mechanism and is capable of relatively high speeds and moderate load carrying capacities. Roll and pitch and yaw axes of robotic means 32 are available. Robotic means 32 is available in moderate work volume, multi-arm configurations such as is illustrated in FIG. 1. A first arm 32a and a second arm 32b are provided on robotic means 32 for operation by one controller (not shown). Multi-tasking software in the controller provides a capable robotic means 32. First arm 32a and second arm 32b provide a near doubling of through-put, achievable with arm 32a alone, for a small fraction of additional cost. A well-known vacuum suction end effector 46 (FIGS. 3 and 4) is provided on each robotic arm 32a, b, for picking up and holding a component 14.

Figure 2:
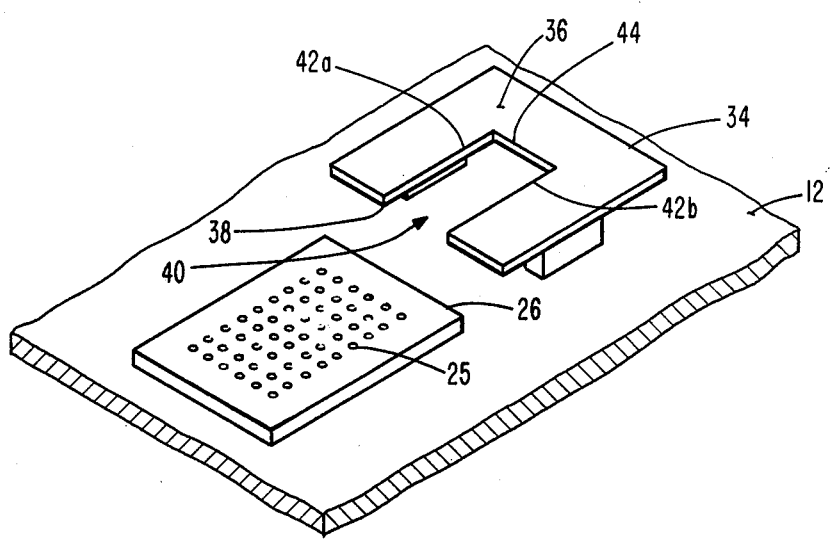
FIG. 2 is a view illustrating an embodiment of a stationary nest used with the robotic work station of FIG. 1.

A novel stationary nest 34 is mounted on support member 12 adjacent shear 26. Nest 34 comprises a generally planar member 36 formed of a suitable metal such as steel or brass. Planar member 36 includes an elongated slot 38 (FIG. 2) formed therein having an open end 40, a pair of opposed sidewalls 42a, 42b, and an endwall 44. Planar member 36 is of a construction sufficient for permitting slightly misaligned component 14 to be moved into slot 38 through open end 40 so that sidewalls 42a, 42b and endwall 44 are between chip 18 and lead guide 24 and provide precise alignment of component 14 to the robot X and Y coordinate axes for subsequent insertion into shear 26. In this manner (FIGS. 3 and 4) slot 38 robotically registers component 14 with robotic means 32. Also, leads 16 extend freely through slot 38 and upward movement of component 14 by robotic means 32 relative to planar member 36, in the direction of an arrow designated A, restrains lead guide 24 so that lead guide 24 is urged from first end 20 of leads 16 toward second free end 22.

In operation, robotic arm 32a picks up component 14 from feeder 28 and moves component 14 through slot 38 of nest 34. Sidewalls 42a, 42b, and endwall 44 are between chip 18 and lead guide 24. As a result, component 14 is robotically registered relative to robotic means 32. Also, in response to movement of component 14 by robotic means 32 in an upward direction, nest 34 restrains lead guide 24 so that lead guide 24 is urged from first end 20 of leads 16 toward second free end 22. Arm 32a then inserts component 14 into typically tapered holes 25 of shear 26 where free end 22 of each lead 16 is simultaneously sheared to a uniform length and lead guide 24 is positioned a precise distance above sheared lead ends 22, i.e., 0.062 inches. At this point arm 32a releases component 14 in shear 26 and returns to feeder 28 to retrieve another component 14 while arm 32b engages the component 14 in shear 26 and moves sheared component 14 to printed circuit board 30 and urges sheared leads 16 into an appropriate position in the holes formed in printed circuit board 30. Arm 32b then returns to retrieve another sheared component 14 inserted in shear 26 by arm 32a. Some further alignment of component 14, relative to robotic means 32, may be accomplished when leads 16 are inserted into tapered holes 25 provided in shear 26.

Insertion of leads 16 into shear 26 is such that lead guide 24 is repositioned vertically to a precise distance above the shear plane. In this manner, lead guide 24 remains adjacent to the newly sheared second ends 22 until leads 16 are inserted into the holes of printed circuit board 30.

Preferably, arm 32b is provided with commercially available insertion force detection apparatus and vision guidance to assist in an enhanced insertion procedure. A preferred vision guidance system utilizes a solid state array camera on arm 32b and backlighting of printed circuit board 30. Also, a programmed systematic search pattern will enhance insertion. However, regardless of the use of available software, insertion force detection, vision guidance and systematic search pattern, the apparatus of this invention is primarily enhanced by the use of the novel stationary nest 34 for precise component alignment and moving lead guide 24 toward second end 22 of leads 16 thus maintaining leads 16 substantially in their designated array position for insertion into the shear and ultimately into correspondingly arrayed holes formed in printed circuit board 30.

The foregoing has described an apparatus for maintaining electronic component pin alignment including a support member, a component feeder, a stationary nest, an adjacent lead shear and a printed circuit board. A component in the feeder includes a chip having a plurality of leads. The leads have a first end connected to the chip and also have a second free end. A movable lead guide engages the first end of the leads. A robot picks up the partially aligned component from the feeder, inserts the component in the stationary nest which exactly aligns it for shear insertion, moves the component relative to the nest for moving the lead guide from the first end of the leads toward the second free end of the leads. As a result, the lead guide is moved to a position wherein the previously known limitations of simultaneous alignment of the leads is substantially overcome.

Having thus described the invention, what is claimed is:

1. An apparatus for maintaining electronic component pin alignment comprising:
   a support member;
   a lead shear mounted adjacent said support member;
   a stationary nest mounted adjacent said support member;
   a printed circuit board mounted adjacent said support member;
   a component feeder mounted adjacent said support member;
   a component in said component feeder, said component being a chip including a plurality of leads having a first end connected to said chip and a second free end, and having a movable lead guide engaging said first end of said leads; and
   robotic means mounted adjacent said support member for picking up said component from said component feeder, inserting said component in said stationary nest, moving said component relative to said stationary nest for moving said lead guide from said first end of said leads toward said second free end of said leads, moving said component from said stationary nest to said shear for shearing said second free end of said leads, and moving said component from said shear to said printed circuit board and urging said leads into corresponding holes formed in said printed circuit board.

2. The apparatus of claim 1 wherein said robotic means includes a first robotic arm and a second robotic arm.

3. The apparatus of claim 2 wherein said first robotic arm releases said component in said shear and said second robotic arm moves said component from said shear to said printed circuit board.

4. The apparatus of claim 1 wherein said stationary nest includes a planar member having an elongated slot formed therein.

5. The apparatus of claim 4 wherein said elongated slot has an open end, two side walls and an end wall.

6. The apparatus of claim 5 wherein said robotic means moves said component into said elongated slot through said open end, said side walls and said end wall being between said chip and said lead guide.

7. An apparatus for maintaining electronic component pin alignment comprising:

a support member;

a lead shear mounted adjacent said support member;

a stationary nest mounted adjacent said support member, said stationary nest including an elongated slot formed therein;

a printed circuit board mounted adjacent said support member;

a component feeder mounted adjacent said support member;

a component in said component feeder, said component being a chip including a plurality of leads having a first end connected to said chip and a second free end, and having a movable lead guide engaging said first end of said leads; and a robotic member having a first robotic arm and a second robotic arm, said first robotic arm movable between said component feeder, said slot formed in said stationary nest and said lead shear, said second robotic arm movable between said lead shear and said printed circuit board.

8. The apparatus of claim 7 wherein said elongated slot has an open end, two side walls and an end wall.

9. The apparatus of claim 7 wherein said first robotic arm moves said component into said elongated slot through said open end, said side walls and said end wall being between said chip and said lead guide.

10. The apparatus of claim 7 wherein said shear positions said lead guide a precise distance from said second free ends.

11. A method for automatically mounting an electronic component in a printed circuit board including the steps of:

robitically picking up said component from a feeder mounted on a support;

moving said component robotically to a nest mounted on said support, said nest including a slot formed therein having sidewalls and an endwall of a construction sufficient for restraining a lead guide on pins of said component during robotic movement of said component so that said lead guide is urged from a first end of said pins toward a second free end of said pins;

robotically moving said component to a shear mounted on said support for shearing said free ends of said pins; and robotically moving said component to said printed circuit board and urging said sheared, free ends of said pins into corresponding holes in said printed circuit board.

* * * * *